(12) United States Patent
Takahashi et al.

(10) Patent No.: US 6,928,595 B2
(45) Date of Patent: Aug. 9, 2005

(54) MEDIUM READING APPARATUS

(75) Inventors: Hiromasa Takahashi, Takasaki (JP); Yoshimi Iso, Maebashi (JP); Satoshi Yamato, Maebashi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 526 days.

(21) Appl. No.: 09/921,792

(22) Filed: Aug. 6, 2001

(65) Prior Publication Data

US 2002/0026607 A1 Feb. 28, 2002

(30) Foreign Application Priority Data

Aug. 31, 2000 (JP) ....................................... 2000-262686

(51) Int. Cl.[7] ............................................. G11C 29/00
(52) U.S. Cl. ....................................................... 714/718
(58) Field of Search ................... 714/718; 365/185.33; 711/114

(56) References Cited

U.S. PATENT DOCUMENTS

| | | | |
|---|---|---|---|
| 5,608,891 A | * | 3/1997 | Mizuno et al. .............. 711/114 |
| 6,393,561 B1 | | 5/2002 | Hagiwara et al. ........... 713/100 |
| 6,493,271 B2 | * | 12/2002 | Matsubara et al. ..... 365/185.33 |
| 6,690,603 B2 | * | 2/2004 | Matsubara et al. ..... 365/185.33 |

* cited by examiner

*Primary Examiner*—Phung My Chung
(74) *Attorney, Agent, or Firm*—Miles & Stockbridge P.C.

(57) ABSTRACT

The configuration of a microcomputer to be used as the control device of a medium reading apparatus is such that writing unit by unit into and erasion block by block from a prescribed area, such as a user data storage area, in a nonvolatile memory built into the microcomputer makes possible, if any writing into the user data storage area is needed, for data to be successively written while updating the units, data included in the prescribed area to be erased when all the units have been written into, and the next data to be written into the erased blocks.

25 Claims, 12 Drawing Sheets

MEDIUM READING APPARATUS

BACKGROUND OF THE INVENTION

The present invention relates to a technique that can be effectively applied to a medium reading apparatus, such as a compact disk drive device, and more particularly to a technique that can be effectively applied to a medium reading apparatus having as its control device a microcomputer provided with a built-in flash memory (hereinafter to be referred to as a microcomputer with built-in flash memory) capable of erasing data collectively block by block.

In recent years, microcomputers have come to be extensively used as control devices for peripheral units, such as external memories, and for communication apparatuses wherein complex control is required. Especially for optical disk drivers and CD-R drivers, of which new models are introduced every few months, microcomputers with rewritable nonvolatile memories, such as flash memories, are extensively used to meet the need to rewrite the firmware, i.e. the microprogram, of the microcomputer for control use every time a new model is developed.

An example of optical disk driver is shown in FIG. 15 to illustrate the case. In FIG. 15, a reference numeral 400 denotes a personal computer, and 200, an optical disk driver. The personal computer 400 and the optical disk driver 200 are connected by a cable 300, and data are transferred via an interface, such as an AT attachment packet interface (ATAPI) or a small computer system interface (SCSI).

The optical disk driver 200 is provided with, as an electronic component, a control board 260 mounted with a microcomputer 250 in addition to such mechanical components as a spindle motor and an optical pickup. According to the prior art, a wide variety of configurations are available for this control board 260, which may be a microcomputer with built-in flash memory referred to above or a conventional single-chip microcomputer among other things.

SUMMARY OF THE INVENTION

A flash memory is a circuit using as its memory cell a nonvolatile memory element having a control gate and a floating gate, whose rewrite characteristics, especially accommodable rewrite frequency, are often dependent on the characteristics of elements, such as the thickness of an insulating film under the control gate and that of an insulating film under the floating gate. For this reason, a flash memory provided independently as a memory device uses specific processes for the formation of insulating layers under the gate and other purposes, which make the chip price relatively high. On the other hand, a wide variety of microcomputer chips are available, and this circumstance makes it difficult to set their prices commensurately high with the addition of a built-in flash memory.

For this reason, a conventional microcomputer with built-in flash memory does not use any special process for the flash memory built into it, but uses the essential process for the element to constitute the microcomputer for the formation of the flash memory. Such a microcomputer sacrifices the characteristics of the built-in flash memory, and its warranted rewrite frequency is only about 100 times.

On the other hand, such peripheral units as an optical disk driver and CD-R drivers should desirably be able to store write conditions differing with the degree of unevenness of hardware and the type of media and other data within the control device in addition to the firmware. However, in order to store such data, the rewrite frequency of 100 times or so warranted for conventional flash memories is insufficient, and a warrant of rewriting in the order of 10,000 times is now demanded.

In response to this requirement, with optical disk drivers having EEPROM-mounted control substrates in addition to microcomputers have emerged. However, the mounting of an electrically erasable and programmable ROM (EEPROM) besides a microcomputer involves the problem of a correspondingly higher system price.

An object of the present invention is to provide a microcomputer with built-in flash memory capable of substantially increasing the rewrite frequency as viewed from outside even if the accommodable rewrite frequency of the memory element itself is relatively low, and thereby to make an inexpensive medium reading apparatus available.

Another object of the invention is to provide a medium reading apparatus mounted with a microcomputer capable of writing data pertaining to the system into a built-in memory relatively many times even in the state of the final user's use, and moreover capable of restricting a cost increase.

The above-noted and other objects and novel features of the invention will become more apparent from the description in this specification when taken in conjunction with the accompanying drawings.

What follows is a brief summary of typical aspects of the present invention disclosed in this application.

Thus, the configuration is constituted such that writing unit by unit into and erasion block by block from a prescribed area, such as a user data storage area, in a nonvolatile memory built into a microcomputer to be used as a control device of a medium reading apparatus is makes possible, and when any writing into the user data storage area is needed, data is successively written while updating the units. When all the units have been written into, data included in the prescribed area is erased and the next data is written into the erased blocks.

More specifically, there is provided a medium reading apparatus provided with a media drive means for driving a medium on which data are recorded; a drive circuit for electrically controlling and driving the media drive means; a read means for reading and supplying data recorded on the medium as electric signals; an amplifying circuit for amplifying output signals of the read means; a signal processing circuit for processing read signals amplified by the amplifying circuit and reproducing data; an interfacing circuit for carrying out communication with another apparatus; and a control device for controlling the drive circuit, signal processing circuit and interfacing circuit, wherein the control device has a semiconductor integrated circuit in which a nonvolatile memory capable of electrically writing data unit by unit and electrically erasing data collectively block by block, each block being larger than the unit, and a control section operating in accordance with a program are formed on a single semiconductor chip; the control section manages units in a prescribed area in the nonvolatile memory, writes data into the prescribed area unit by unit, erases data from a block included in the prescribed area when data are written into a plurality of units included in the prescribed area, and writes data in the units in the erased block.

In the apparatus described above, the nonvolatile memory built into a microcomputer as the control device makes it possible to substantially increase the rewrite frequency as viewed from outside even if the accommodable rewrite frequency of the memory element itself is relatively low, and thereby to make an inexpensive medium reading apparatus available.

In the foregoing case, the number of blocks included in the prescribed area may be either one or more. Where the number of blocks is two or more, collective erasure of blocked data may cover either all the blocks at a time or only one of the blocks.

The apparatus will prove particularly effective if the nonvolatile memory built into the control device consists of an element formed in the same process as that of forming the element constituting the control section. Although the element constituting the nonvolatile memory is formed in a different process from that of forming the element constituting the control section can constitute a memory element permitting more frequent rewriting, the accommodable rewrite frequency of a memory element formed in the same process as that of forming the element constituting the control section is lower, and accordingly the application of the apparatus described above would prove more effective.

The apparatus will also prove effective where the control section is to write data generated by the execution of an application program stored in the nonvolatile memory unit by unit into the prescribed area of the nonvolatile memory. This is because, while it is often unnecessary to rewrite initially set data for controlling the system, data resulting from the execution of an application program often require rewriting, and storing of data generated by the execution of an application program will prove extremely useful for subsequent control.

More desirably, the functions of unit management, data writing and data erasion by the control section over the nonvolatile memory should be realized by an application program stored in the nonvolatile memory. This makes it possible to realize a desired function without having to change the hardware, thereby enabling a change in function to be accomplished rapidly and enhancing the flexibility of the system.

Furthermore, the apparatus described above may also prove effective where data written into the nonvolatile memory concern the type of the medium. Since a wide variety of recording media are commercially available today, storing information concerning the type of the medium in the nonvolatile memory facilitates the most suitable access to each type of medium, thereby making it possible to shorten the access time and to enhance the reliability of data.

It is desirable that, into each of the units constituting the prescribed area of the nonvolatile memory, data indicating whether or not the data in the unit are significant are written (search data). If such search data are written, the unit in which the latest data are stored can be detected by reading out the units sequentially and identifying the search data, resulting in efficient unit retrieval.

Further, into each of the units constituting the prescribed area of the nonvolatile memory, data for use in checking the reliability of data in the unit are written. This serves to ensure the reliability of the data that are read out.

If the configuration is such that, when reading data from the medium, check data for the read data are referred to and if the read data are judged to be abnormal, the data written before the writing of the currently read data be read out, it can be made possible to avoid a situation in which any error in the immediately preceding writing invites reading of unreliable data or total unavailability of read data.

The apparatus described above may also prove effective where data to be written into the prescribed area of the nonvolatile memory are information concerning manufacturing fluctuations in the media drive means and the read means. Storage of information concerning fluctuations in the mechanism of the medium reading apparatus makes possible optimal access with the fluctuations compensated for, and accordingly serving to shorten the access time and to enhance the reliability of data.

The apparatus may also prove effective where data to be written into the prescribed area of the nonvolatile memory are information concerning characteristics of the medium obtained by accessing the medium. Storage of information concerning characteristics of the medium in the nonvolatile memory facilitates accessing, when the same medium is inserted next time, the medium under the most suitable conditions for that particular medium by reading the information concerning it, thereby making it possible to shorten the access time and to enhance the reliability of data.

DESCRIPTION OF THE PREFERRED EMBODIMENT

A preferred embodiment of the present invention will be described below with reference to the accompanying drawings.

Figure 1:
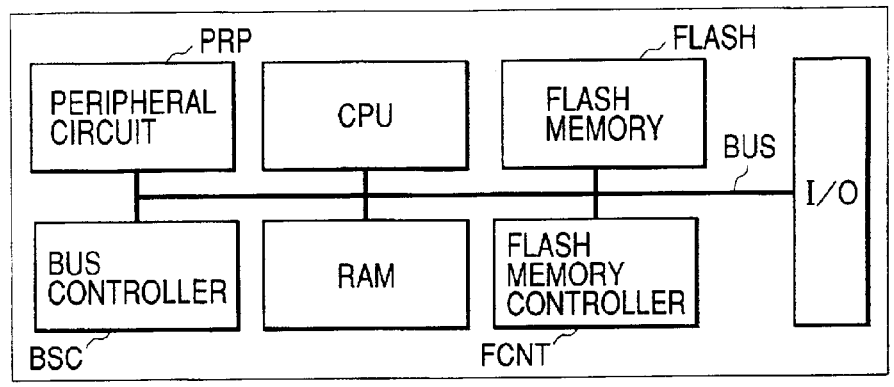
FIG. 1 is a block diagram schematically illustrating one example of configuration of a microcomputer with built-in flash memory to which the present invention is applicable.

FIG. 1 is a block diagram schematically illustrating one example of configuration of a microcomputer with built-in flash memory to which the invention is applicable.

In FIG. 1, sign FLASH denotes a flash memory provided with a memory array in which memory cells, each comprising a MOSFET having a two-layered gate structure of a floating gate and a control gate, arranged in a matrix form; FCNT, a flash controller for writing into and erasing from the flash memory; CPU, a central processing unit taking charge of control over the whole chip; RAM, a random access memory for temporarily storing data and providing a work area to the central processing unit CPU; PRP, peripheral circuits including various timer circuits, an A/D converter and a watchdog timer for system monitoring; BUS, an internal bus connecting the central processing unit CPU, flash memory FLASH, flash controller FCNT, RAM, and interfacing circuit SCI; I/O, an interfacing circuit including an input/output buffer for supplying signals on the internal bus BUS to an external bus and taking in signals on the external bus and a serial communication port for carrying out serial communication with external units; and BS, a bus controller for controlling the bus occupying right on the internal bus BUS and the like.

The flash controller FCNT is provided with a control register, and so configured that, when the CPU writes into the control register in accordance with a program stored in the flash memory or the RAM, the flash controller FCNT forms a control signal for the flash memory circuit FLASH according to the bit state of the control register to cause such actions as writing, erasion, reading and verification to be performed.

The flash controller FCNT is provided with, in addition to the control register for write/erasion control, an erasion selecting register for selecting the block to be erased out of a plurality of blocks in the memory at the time of erasion; a register for setting a value for voltage trimming, and another register for holding relief information for replacing a memory column involving any defective bit in the memory array with a reserve memory column. It is also possible, though not absolutely necessary, to store the value for this trimming register in a prescribed area in the flash memory circuit FLASH and to read it out of the flash memory circuit for setting it in the trimming register at the time of resetting.

Though not shown in FIG. 1, in addition to the aforementioned circuit blocks, an interrupt control circuit for determining the occurrence of any request for interrupt to the CPU and the priority of the request and effecting an interrupt accordingly, a direct memory access (DMA) transfer control circuit for controlling DMA transfers between the RAM and the flash memory FLASH, and an oscillator for generating a necessary clock signal for system operation may be provided as required.

In the microcomputer with built-in flash memory embodying the invention as described above, all the circuit blocks shown in FIG. 1 are formed on a single semiconductor chip of monocrystalline silicon or the like. Moreover, elements for the flash memory FLASH are formed by utilizing the process of forming the elements constituting the CPU as far as practicable. Thus, there is used a process involving no or a minimized number of special steps for the formation of the element constituting the flash memory.

Figure 2:
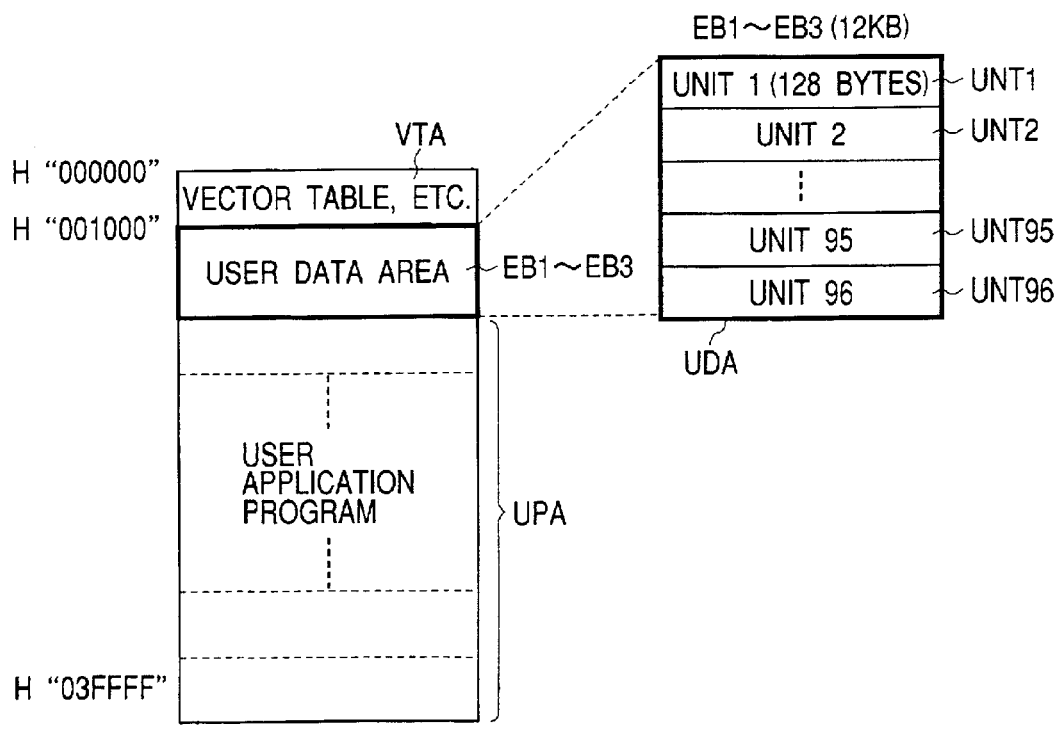
FIG. 2 is a memory map illustrating the address space configuration of the built-in flash memory.

In this embodiment, as shown in FIG. 2 for instance, out of the address spaces H000000 through HFFFFFF of the central processing unit CPU, H000000 through H03FFFF are allocated as a storage area for the built-in flash memory FLASH, and 12 k bytes beginning with H001000 in these spaces are allocated as a user data area UDA. H000000 through H000FFF are allocated as a vector table area VTA for use when any interrupt occurs to the CPU, and the remaining area is allocated as a storage area UPA for user-developed application programs (hereinafter to be referred to as user programs).

Further, the 12 k-byte user data area UDA is divided into 96 units UNT1 through UNT96 of 128 bytes each, and data are written on a unit-by-unit basis. The user data area UDA is subdivided into three blocks EB1 through EB3 of 4 k bytes, i.e. 32 units each, to make possible block-by-block erasion.

Figure 3:
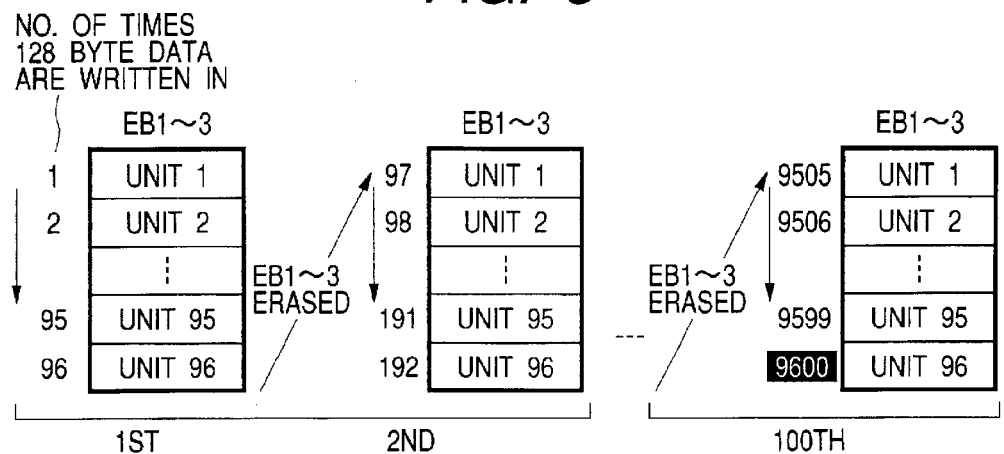
FIG. 3 illustrates one example of procedure of writing into the built-in flash memory in the microcomputer with built-in flash memory to which the invention is applied.

In this embodiment, write and erase controls are accomplished in such a way that, when data to be written into the user data area UDA according to a user program emerge, they are sequentially written unit by unit from the unit UNT1 as shown in FIG. 3 and, upon completion of writing of the final unit UNT96, the blocks EB1 through EB3 are collectively erased, followed by writing again unit by unit from the unit UNT1 onward. The size of a block, which is the unit of erasion, is not limited to 4 k bytes, and the whole flash memory need not be composed of blocks of the same size. For instance, the user program area UPA may as well be configured of blocks, some of which are 32 k bytes in size and others are 64 k bytes.

According to this write/erase system, if the accommodable rewrite frequency of each unit is 100 times, data can be written into altogether 96×100=9600≈10,000 units. As the whole user data area is treated as one unit in a conventional microcomputer with built-in flash memory, once data to be written into the user data area emerge, the whole is rewritten, i.e. the data are written after collectively erasing the whole user data area, with the result that there is no guarantee for further writing after data have been rewritten 100 times. For this reason, after rewriting into the flash memory has been done 100 times, the reliability of data deteriorates, but where the write/erase system of this embodiment is used, if writing is done unit by unit (128 bytes each), apparently about 100 times as frequent rewriting can be warranted.

If the data to be written are more than 128 bytes, they will have to be written into two or more units, but in a system to which the application of the invention is anticipated, such as an optical disk driver or a CD driver, the data written at a time are usually not more than 128 bytes, and accordingly there is provided an advantage substantially equivalent to a warrant of about 10,000 times of rewriting.

Figure 4:
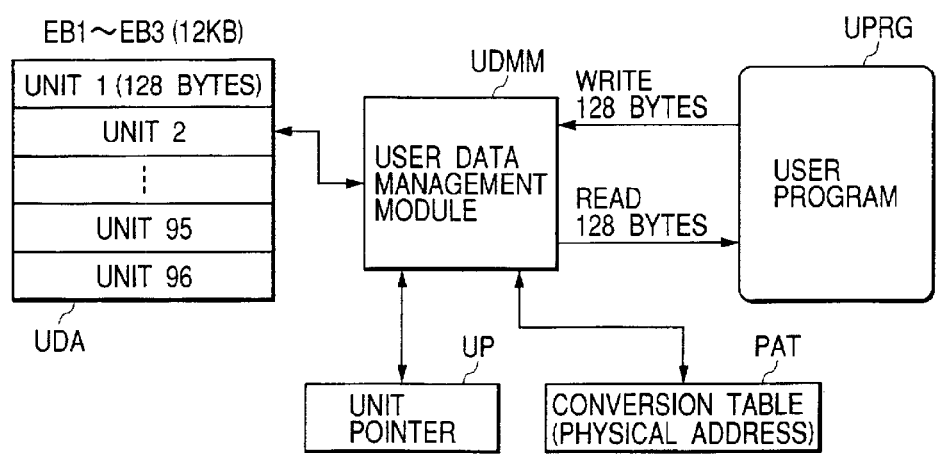
FIG. 4 illustrates the relationship among a user data management module, a user data area and a user program in the microcomputer with built-in flash memory to which the invention is applied.

FIG. 4 illustrates a schematic configuration of the present invention for implementing the write control described above. In FIG. 4, the left side block UDA is the user data area set in the flash memory; the central block UDMM, a user data management module the invention requires; UP, a unit pointer under the management of this module UDMM; and PAT, an address conversion table for holding the relationship between a pointer for obtaining the physical address of the pertinent unit in the CPU from the value of the unit UP and the physical address in a data table form. This address conversion table PAT is provided in, for instance, the user program area UPA of the built-in flash memory FLASH.

The user data management module UDMM has a function to reference, when it receives a request from the user programs UPRG for writing into the user data area UDA, the unit pointer to automatically search for the unit to be written into next, and to write data into the unit thereby located. Whereas a module having such a function can be realized either with hardware or software, an example using software will be described below. Therefore, the user data management module UDMM may as well be configured as a subroutine in a part of a user program. In that case, the user data management module UDMM is configured to be actuated by a write request from the main routine or some other subroutine of the user program. The unit pointer UP is provided in a part of the RAM or a general-purpose register.

Figure 5:
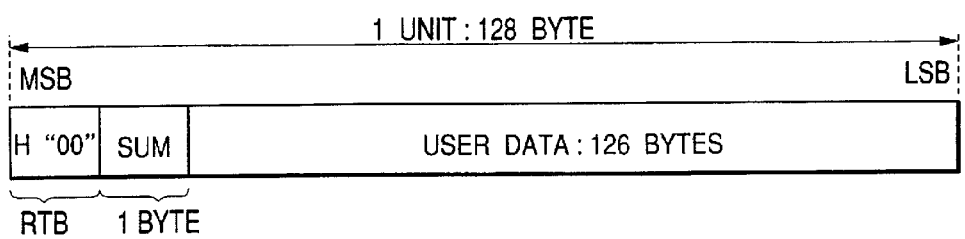
FIG. 5 illustrates an example of user data configuration in one unit in the microcomputer with built-in flash memory to which the invention is applied.

Further, a user data management module UDMM to be described below is configured, though its configuration is not confined to this, to add a retrieval tag byte RTB and check data SUM to each unit of user data, as shown in FIG. 5, to ensure accuracy of the user data. Each of the retrieval tag byte RTB and the check data SUM may have a size of, for instance, one byte (eight bits). Therefore, the real size of a unit of user data is 126 bytes.

Figure 6:
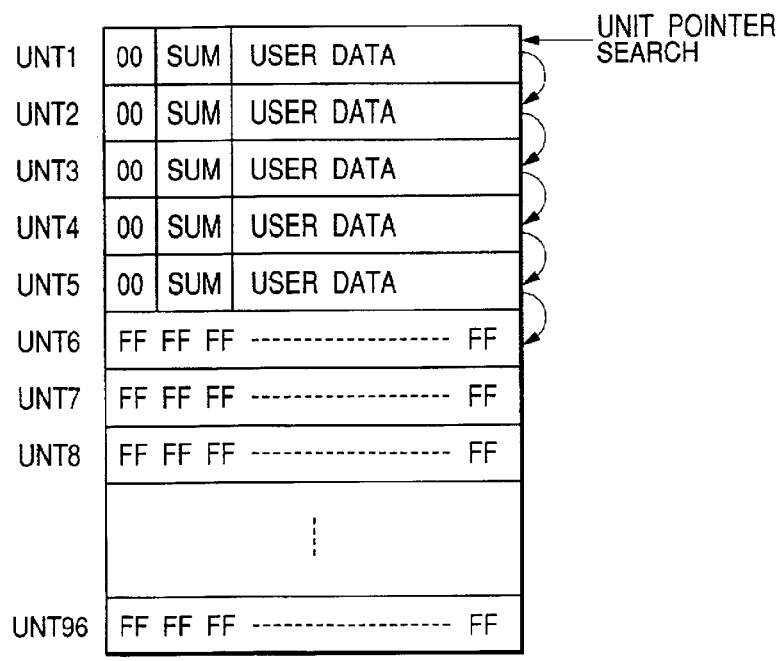
FIG. 6 illustrates an example of state of data storage in the user data area in the microcomputer with built-in flash memory to which the invention is applied.

When writing into the flash memory is done, H "00" is set as the retrieval tag byte RTB in a hexadecimal notation, and a value SUM, resulting from the addition of "1" of every bit of the 126-byte user data, is set as the check data SUM. Therefore, setting of H "00" as the retrieval tag byte RTB means that the 126-byte user data of the unit are already written (significant). FIG. 6 illustrates a data storage state in which data are written in up to the unit UNT5 of the user data area UDA. In this example, a memory cell in an erased state has a high threshold, and its stored data are matched with logic "1", though it is not confined to this arrangement. Therefore, in the example of FIG. 6, the stored data from the units UNT6 through UNT96 are all "1", i.e. expressed in the hexadecimal notation as "FFFFFF . . . . . . . . . FF".

Figure 7:
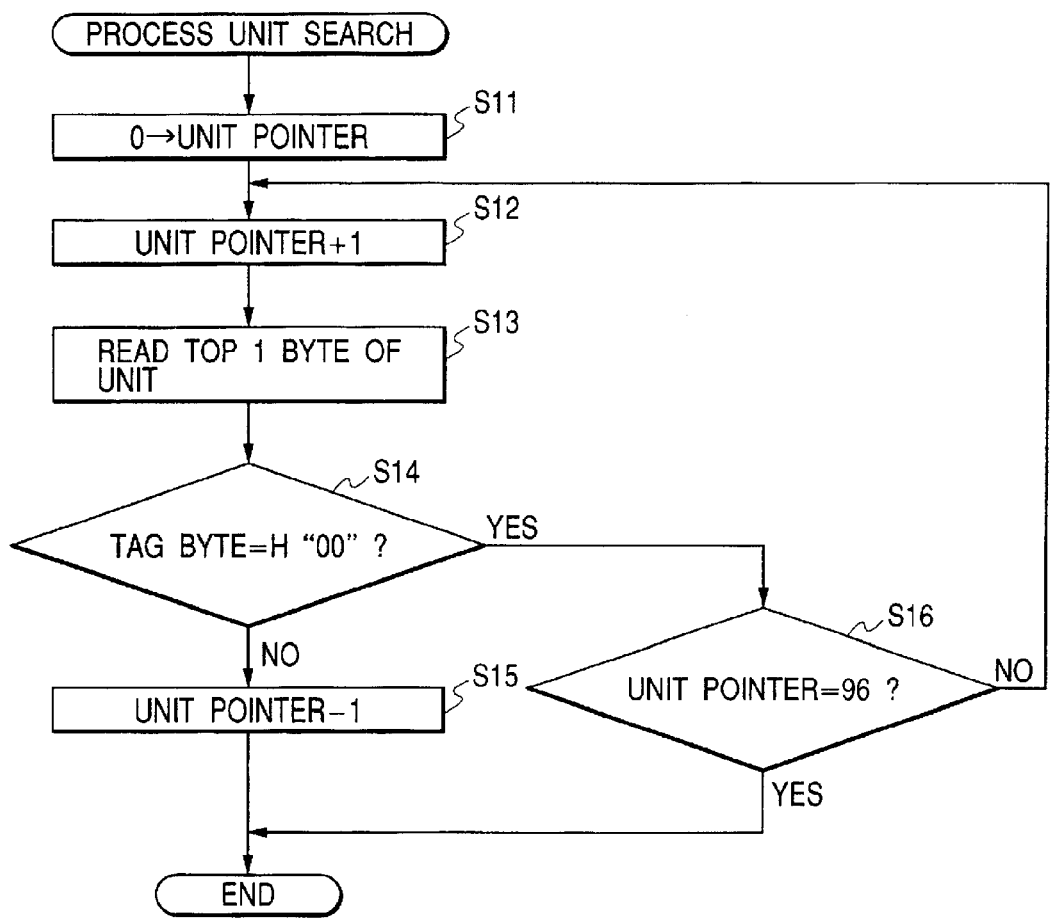
FIG. 7 is a flow chart showing an example of specific procedure of unit searching as a function to constitute the user data management module in the microcomputer with built-in flash memory to which the invention is applied.
Figure 8:
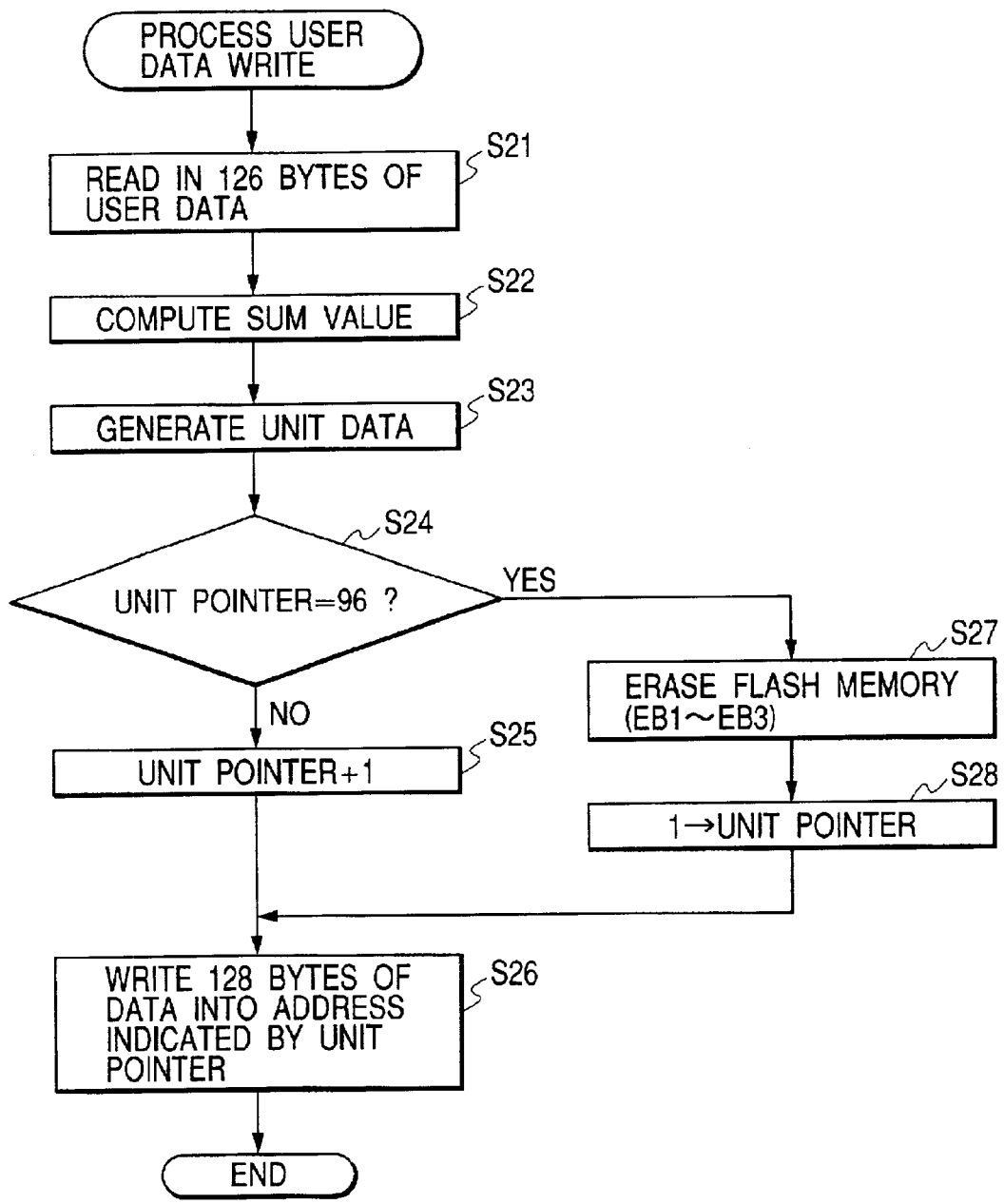
FIG. 8 is a flow chart showing an example of specific procedure of user data writing as a function to constitute the user data management module.
Figure 9:
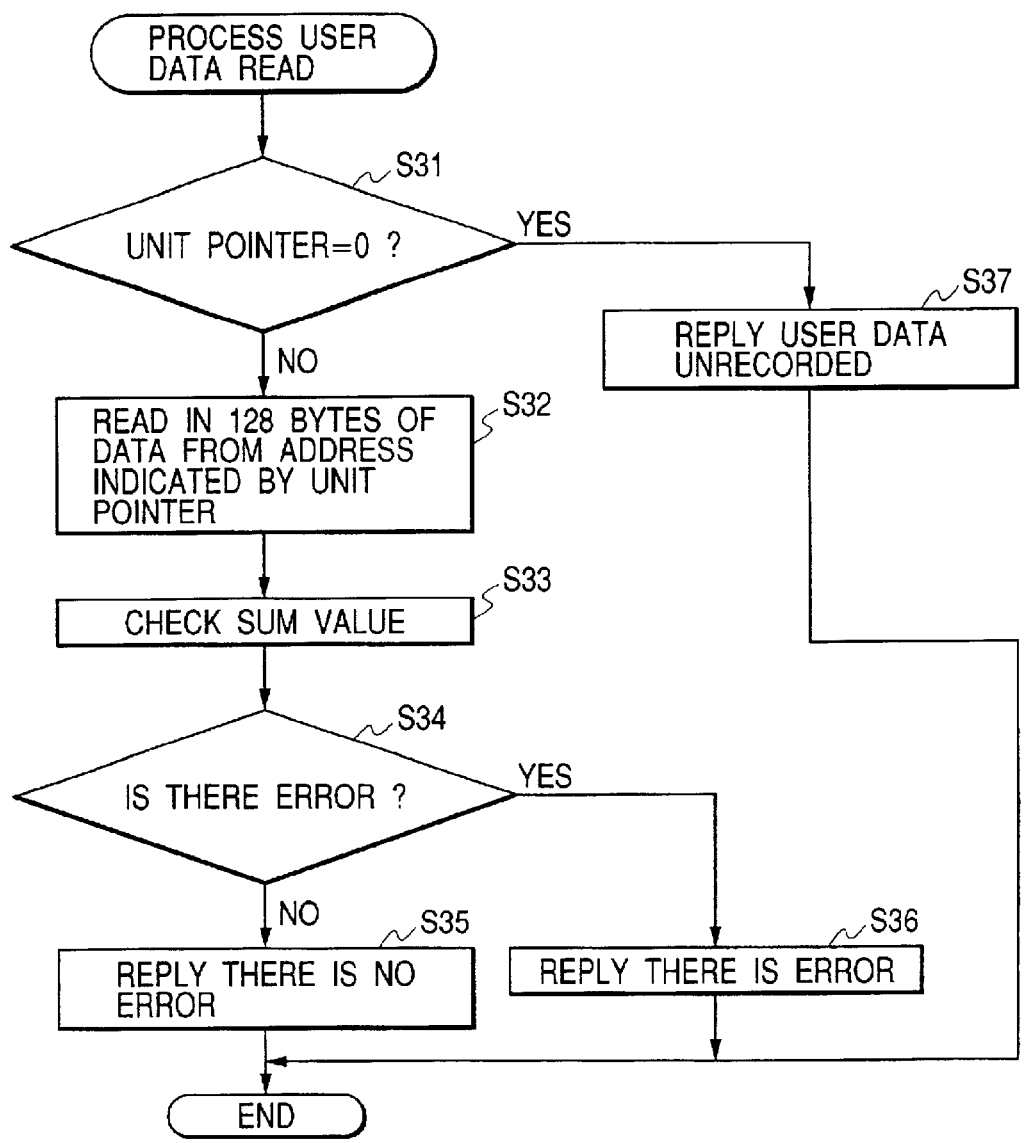
FIG. 9 is a flow chart showing an example of specific procedure of user data reading as a function to constitute the user data management module.

FIG. 7 through FIG. 9 are flow charts showing specific examples of three basic functions (subroutines in a program) where the user data management module UDMM is to be configured of software. The three basic functions here are a function to implement unit pointer management, i.e. unit search processing to search for the unit to be written into next in the flash memory (FIG. 7), a function to implement user data write processing to write user data into the located unit (FIG. 8), and a function to implement user data read processing to read data out of the user data area UDA (FIG. 9).

The unit search processing of FIG. 7 is executed when the system is started up, though it is not restricted to this timing. Upon start of this unit search processing, first the unit pointer UP is set to "0" (step S11). At the next step S12, after incrementing the unit pointer UP (+1), the leading byte of the unit that unit pointer UP points to, i.e. the retrieval tag byte RTB, is read out (step S13). Hereupon, the address conversion table PAT is referenced, the count of the unit pointer UP is converted into the physical address of the pertinent unit in the CPU space, and the flash memory is accessed by that physical address to read out the matching user data. Instead of referencing the address conversion table PAT and obtaining the physical address, it is also possible to apply a prescribed arithmetic operation to the unit pointer UP and thereby obtain the physical address. More specifically, it is possible to obtain the physical address to be accessed by executing, with the CPU for instance, the computation of the count of the unit pointer UP×128 (=the number of bytes per unit)+the leading address (H "001000") of the user data area UDA.

Then at step S14, it is checked whether or not the retrieval tag byte RTB at the top of the unit data read out of the flash memory is H "00". If RTB is found to be "00", i.e. the data are found "significant", the process goes ahead to step S16 to judge whether or not the count of the unit pointer is "96". If the count of the unit pointer is found to be "96", the unit search processing is completed. On the other hand, if it is found at step S16 that the count of the unit pointer is not "96", the process returns to step S12 to increment the count of the unit pointer UP, read out the data again, and checks whether or not the retrieval tag byte RTB at the top is H "00".

By checking the retrieval tag byte RTB at the top while incrementing the unit pointer by one at a time, the unit number next to the final unit in which user data are written (UNT6 in the example shown in FIG. 6) is detected. Namely, this refers to a case in which it is judged at step S14 that RTB is not H "00" and that data are "not yet written". Upon detection of this unit, the process goes ahead to step S15 to decrement the count of the unit pointer UP (−1), and the unit search processing is thereby completed. As a result, the unit pointer UP holds the unit number of the final unit in which user data are written (UNT5 in the example shown in FIG. 6).

As the count of the unit pointer UP is decremented (−1) at the final step S15 of the flow chart of FIG. 7, if no data are written in the user data area after the erasion of the flash memory, the count of the unit pointer UP is reset to "0". This serves to accelerate the response in user data read processing to be described later with reference to FIG. 9.

Although the flow chart of FIG. 7 shows an example in which search is done sequentially from the leading unit forward, it may as well be done sequentially from the final unit backward. It is also possible to check the leading unit UNT1 first and, if the data are judged to be "significant", to check an intermediate unit (e.g. UNT48) If the result of this check shows that data are "not yet written", another unit between "UNT1" and "UNT48" (e.g. UNT24) is checked or, if the data are found "significant", a unit between "UNT48" and "UNT96" (e.g. UNT72) is checked, and so forth. This successive bisecting of the remaining search area can as well be applied to locate the object of search more efficiently.

User data write processing charted in FIG. 8 is started when a request to write user data comes from a user program. Upon start of this processing, first the user data to be written into the flash memory (transmitted from an external apparatus and held by the I/O interfacing circuit or the like) are written in 126-byte units and stored into a prescribed area in the RAM (step S21). If the user data are less than 126 bytes then, other data than the real user data are converted into either logic "1" or logic "0". More specifically, if the real user data are 100 bytes for instance, 26-byte data in which every bit is either logic "1" or logic "0" are added after these 100 -byte data. Then the bits of the other parts of the user data are added to compute the SUM value (step S22).

At the next step S23, all "0" (H "00" in hexadecimal notation) are set for the leading byte of the unit, and the SUM value computed at step S22 is set for the second byte from the top, followed by the generation of 128-byte long user data having the structure of FIG. 5 to which 126-byte user data have been added. Then at the following step S24, the unit pointer UP is referenced to judge whether or not the counter of the pointer is "96" and, if it is not "96", the count of the pointer UP is incremented (+1) (step 25). Then 128-byte write data are written into the unit that the pointer points to, thereby completing this processing (step S26). At this step S26, the address conversion table PAT may as well be referenced to convert the count of the unit pointer UP into the physical address of the pertinent unit in the CPU space, and the flash memory may be accessed by that physical address to do the intended writing.

On the other hand if at step S2 the count of the unit pointer UP is judged to be "96", the process goes ahead to step S27, and the user data area UDA of the flash memory is erased. This data erasion may cover all the three blocks constituting the user data area UDA, data in only one of the blocks may as well be erased. After the completion of data erasion at step S27, with "1" set for the count of the unit pointer UP at the next step S28, the process goes ahead to step S26, 128-byte write data are written into the unit which the pointer points to, thereby completing this processing.

User data read processing charted in FIG. 9 is started when a request to read user data comes from a user program. Upon start of this processing, first the unit pointer UP is referenced at step S31 to judge whether or not the count of the pointer is "0". If the count of the unit pointer UP is "0", this means that no user data have been written into the user data area UDA of the flash memory as described with reference to the flow chart of FIG. 7, and therefore the process goes ahead to step S37, giving a reply of user data "unwritten" to the user program to complete the processing. This serves to shorten the waiting time of the user program.

If it is judged at step S31 that the count of the unit pointer UP is not "0", the process goes ahead to step S32 to read user data out of the unit that the unit pointer UP points to. At this step S32, the address conversion table PAT is referenced to convert the count of the unit pointer UP into the physical address of the pertinent unit in the CPU space, and the flash memory is accessed by that physical address to do the intended reading.

At the next step S33, the bits of the parts of the user data read out at step S32 from the third byte onward from the top are added to compute the SUM value, and the computed value and the SUM value at the second byte of the read data are compared to judge whether or not there is any error (step S34). If it is judged that there is "no error", the user program is informed of the absence of error in the read data at the next step S35 to complete this processing. Thus, there is provided the advantage of enhancing the reliability of read data by checking their SUM value. Then read data of 126 bytes, for instance, are read out.

On the other hand, if it is judged at step S34 that there is any "error", the process goes ahead to step S36 to inform the user program of the presence of any error in the read data to complete this read processing. It is also possible, if it is judged at step S34 that there is any "error", to decrement the unit pointer UP (−1) to read out data out of the immediately preceding unit after informing the user program of the presence of the error at step S36. With a conventional write/erase system, if there is any faulty writing due to power failure, noise or the like, read data sometimes cannot be obtained by user data read processing, but this embodiment of the invention, because earlier written data remain in the flash memory, these remaining data can be utilized for flexible response.

The functions or the subroutine programs for their execution described above with reference to FIG. 7 through FIG. 9 can as well be incorporated into the user program. It is also possible to incorporate them into the operating system (OS) for the write/erase system to be executed by the CPU. This OS to be executed by the CPU, like user programs, may be stored in the flash memory in another area than the user program area, or the configuration may as well be such that the OS stored in an external memory is read into an internal RAM for execution.

As stated above, the user data management module UDNM can be realized with hardware instead of software, and in that case functions for that purpose may be provided within the flash controller FCNT shown in FIG. 1. However, it is the simplest way to realize it with software as in the above-described embodiment, with an additional advantage of a lower cost of the alteration involved.

Figure 10:
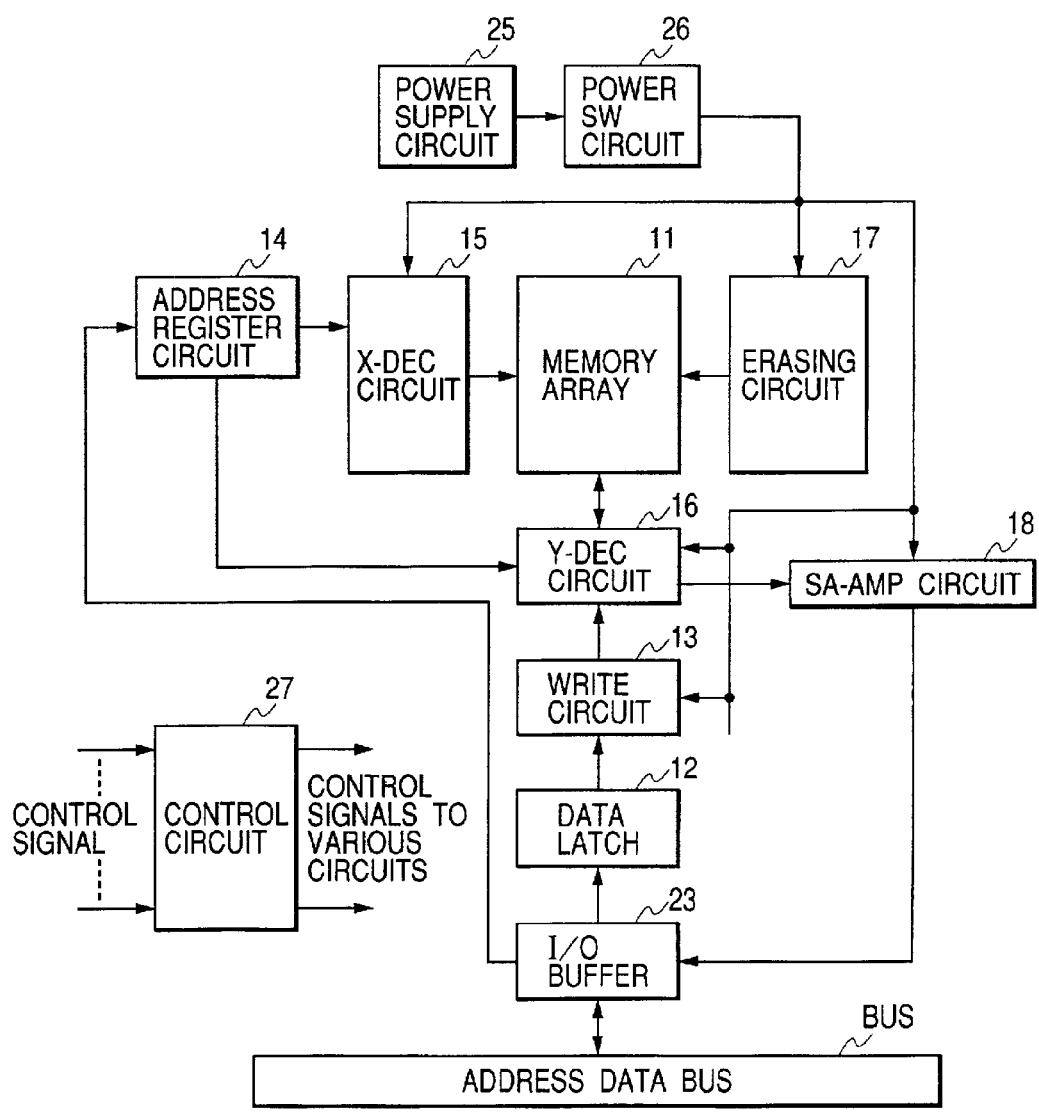
FIG. 10 is a block diagram schematically illustrating one example of configuration of the built-in flash memory in the microcomputer with built-in flash memory to which the invention is applied.
Figure 11A:
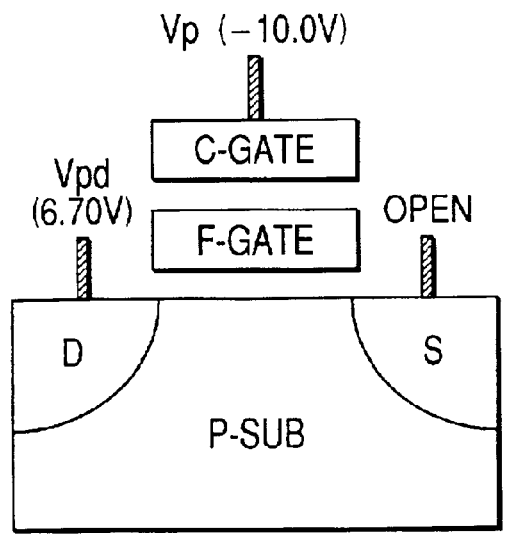
FIGS. 11(A) and 11(B) show sections illustrating the configuration of the memory element of the flash memory as a memory cell and an example each of bias state at the time of writing and erasing.
Figure 11B:
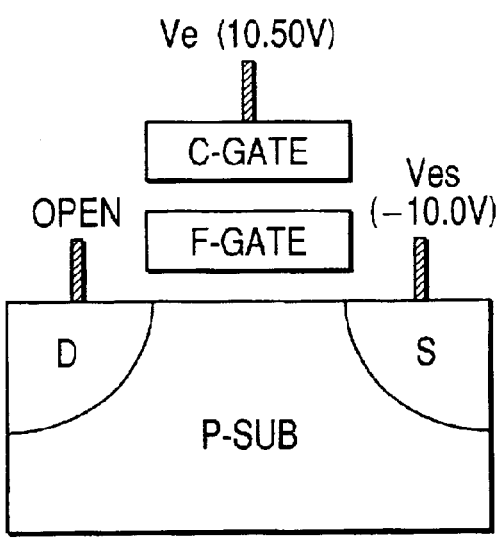

FIG. 10 schematically illustrates the configuration of the flash memory circuit FLASH described above. In FIG. 10, reference numeral 11 denotes a memory array in which are arranged in a matrix form memory cells as nonvolatile memory elements, each comprising a MOSFET of a two-layered gate structure of a floating gate F-GATE and a control gate C-GATE as shown in FIGS. 11(A) and 11(B); 12, a data register for holding write data entered from the bus BUS; and 13, a write circuit for writing unit by unit into the memory array 11 on the basis of the data held by the data register 12.

Further, reference numeral 14 denotes an address register for holding address signals; 15, an X decoder for selecting one word line matching an X address taken into the address register 14 out of the word lines in the memory array 11; 16, a Y decoder for decoding a Y address taken into the address register 14 and selecting data of one byte (or one word) in one unit; 17, an erase control circuit for selecting the blocks to be erased and performing erasion block by block by applying an erasion voltage; and 18, a sense amplifier for amplifying and outputting data read out of the memory cell array 11.

The flash memory is further provided with, in addition to the above-described circuit blocks, a control circuit 27 for forming controls signals for controlling the circuit blocks of the flash memory in accordance with commands and control signals supplied from the CPU; an I/O buffer circuit 23 for inputting and outputting address signals and data signals; a power supply circuit 25 for generating voltages required within the chip including a write voltage, an erase voltage, a read voltage and a verify voltage; and a power switching circuit 26 for selecting a desired voltage out of these voltages according to the operating state of the memory and supplying it to the memory array 11.

Any flash memory currently available for mounting on a microcomputer with built-in flash memory uses either a system of writing into a memory element through an FN tunnel or a system of writing with hot electrons by flowing a drain current. The two systems are the same in element structure though differing in the bias voltage applied at the time of writing. FIGS. 11(A) and 11(B) illustrate bias states at the time of writing and that of erasing in a flash memory of the FN tunnel type out of the two systems. As the FN tunnel system needs a less write current, making possible collective writing of a unit of many bytes, such as 128 bytes, connected to a single word line and reducing the length of time required for writing, this embodiment uses a memory element of the FN tunnel system. The invention, however, is not limited to the use of this system, but a flash memory of the hot electron system can be used as well, in which case writing of one unit can be accomplished by writing one byte at a time and repeating it 128 times.

In the operation of writing into a flash memory of the FN tunnel system, by setting the voltage of the drain region of the nonvolatile memory element to 6.7 volts (V) or so and that of the word line to which the control gate C-GATE is connected to −10.0 V or so as shown in FIG. 11(A), a negative charge is drawn from the floating gate F-GATE to the drain region D and the threshold voltage is reduced to a low level (logic "0"). In the erasing operation, by setting the source region S and the substrate P-SUB to 10.0 V or so and the control gate C-GATE to a high voltage of 10.5 V or so as shown in FIG. 11(B), a negative voltage is injected into the floating gate F-GATE to raise the threshold to a high level (logic "1"). This results in storage of one-bit data in one memory element. The bias voltage, however, is not limited to the above-described example.

Figure 12:
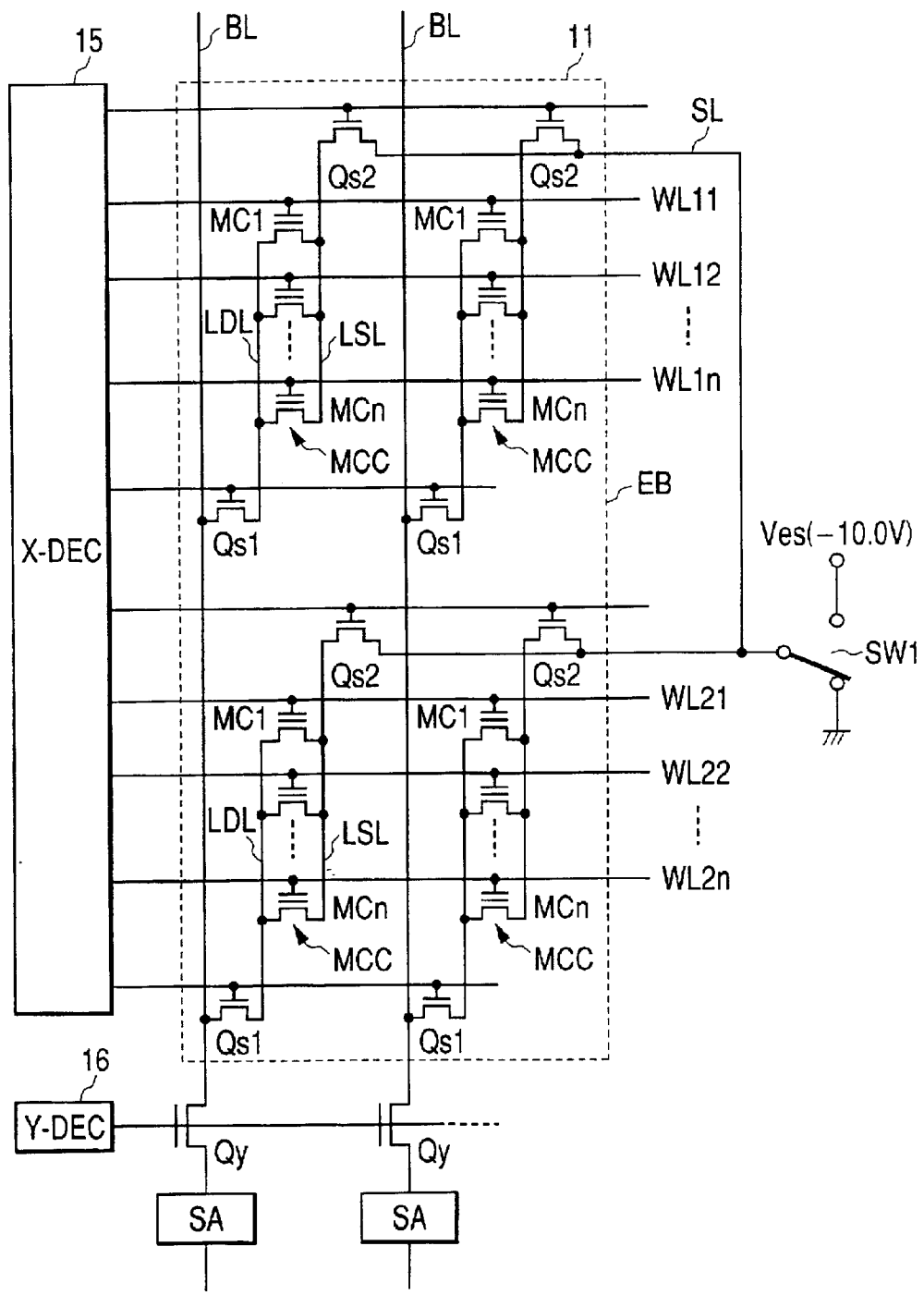
FIG. 12 is a circuit diagram illustrating an example of circuit configuration of the memory array section of the built-in flash memory.

FIG. 12 illustrates a specific example of configuration of the memory array 11. The memory array 11 of this embodiment, as shown in FIG. 12, consists of a plurality each of memory columns MCC arranged in the line direction (direction of word lines WL) and the column direction (direction of bit lines BL), each memory column MCC consisting of n memory cells (MOSFETs with floating gates) MC1 through MCn, arranged in parallel in the column direction and the source and drain of each being connected in common. FIG. 12 shows four typical memory columns MCC of them.

The drains and sources of the n memory cells MC1 through MCn of each memory column MCC are connected to common local drain lines LDL and common local source lines LSL, respectively. The local drain lines LDL are connected to bit lines BL via selector switches MOSFET Qs1, and the local source lines LSL are connected to a common source line SL via selector switches MOSFET Qs2. The common source line SL is configured to be further connectable via a switch SW1 to a grounding point or an erasion voltage supply terminal Ves.

In the flash memory of this embodiment, memory cells connected to this common source line SL constitute one block EB, which is the unit of erasion. On the other hand, the control gates of memory cells MC in the lateral direction are connected to common word lines WL11, WL12 ... WL1n; WL21, WL22 ... WL2n, respectively, and memory cells commonly connected to one word line constitute one unit (one sector), which is the unit of writing. It is also possible to form one block of memory cells on one well region, and erasion is accomplished by applying a voltage between that well and the control gate.

To each bit line BL is connected the sense amplifier SA via a column switch Qy turned on or off according to a selection signal from the Y decoder. When data are to be read out, a word line WL is set to a selection level. This causes each memory cell to let a drain current flow according to the threshold of the memory cell. For instance, depending on the threshold, some memory cells are in a state in which no drain current flows, while other memory cells are in a state in which a prescribed drain current flows. Depending on whether or not a drain current flows, the potential of the bit line BL varies, and the variation is amplified and detected by the sense amplifier SA. When data are to be written in, write data are held by the sense amplifier SA, and a write voltage is applied to the drain of a memory cell selected according to the data via a bit line BL and when a local drain line LDL.

When data are to be written in, one word line matching an address that is supplied is selected, and a write voltage of −10 V or so is applied. Then, a potential is applied to the bit line BL according to a bit matching the write data; a potential of 6.7 V or so, if the bit is logic "0" or 0 V, if the bit is logic "1". In a memory cell whose bit line BL has a potential of 6.7 V, the electric charge is drawn out of the floating gate to reduce the threshold to a low level (logic "0"). On the other hand, in a memory cell whose bit line BL has a potential of 0 V, the electric charge is not drawn out of the floating gate, and the threshold is kept at a high level (logic "0").

When data are to be erased, every word line in a block EB is set to a potential of 10.5 V or so. In the memory cell connected to each such word line the selector switch MOSFET Qs1 on the drain side is turned off to place the drain in an open state, while the selector switch MOSFET Qs2 on the source side is turned on, and the switch SW1 is turned to the erase voltage terminal Ves side to apply a negative voltage of −10.0 V to the source. This causes every memory cell in the block to undergo electric charge injection into the floating gate, and the threshold is raised to a high level (logic "1").

When data are read out, one word line matching the supplied address is selected and a voltage of 4.2 V or so is applied to it after every bit line BL is precharged to a potential of 1.0 V or so. Along with the turning-on of the selector switch MOSFET Qs2 on the source side, the switch SW1 is turned over to the grounding point side, and a voltage of 0 V is applied to the source via the common source line SL. This causes the memory cell connected to the selected word line to undergo control of the matching bit line BL. When the threshold is low, a current flows to reduce the potential of the bit line BL, or when the threshold is high, as no current flows, the potential of the bit line BL is kept at the precharge level. This difference in potential is amplified and detected by the sense amplifier SA.

Figure 13:
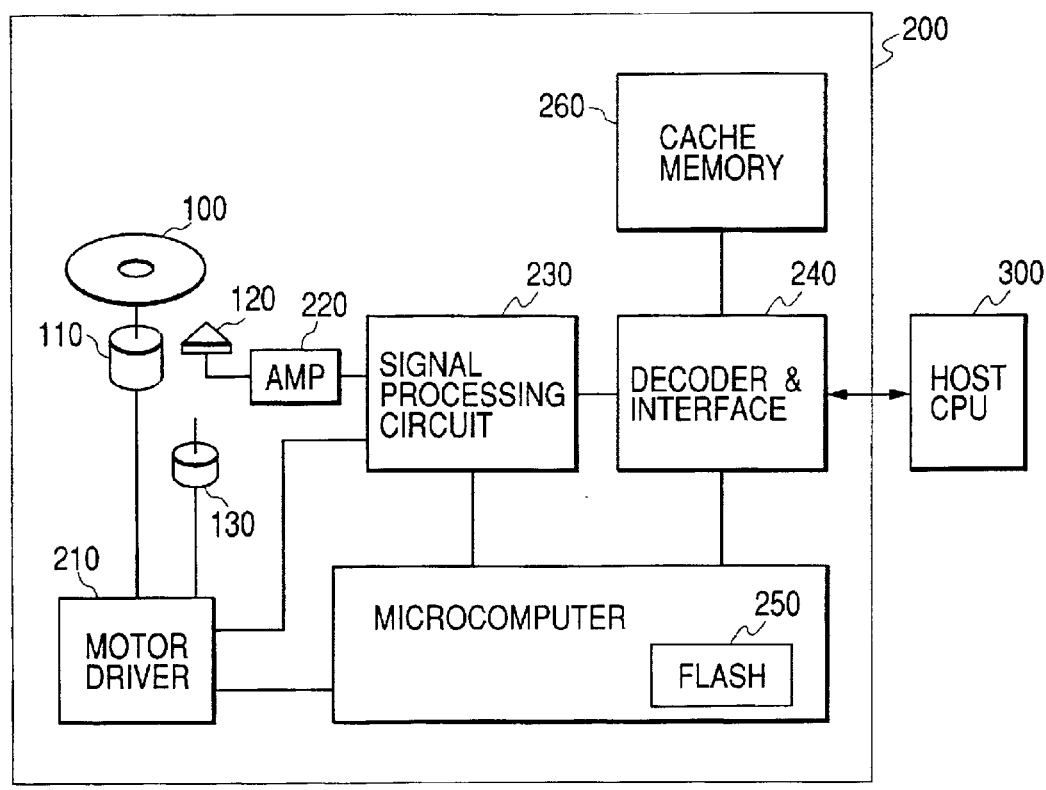
FIG. 13 is a block diagram illustrating a typical configuration of a CD-ROM drive unit as an example of medium reading apparatus according to the invention.

FIG. 13 illustrates a typical configuration of a CD-ROM drive unit as an example of medium reading apparatus according to the invention using a microcomputer with built-in flash memory composed as described above.

In FIG. 13, reference numeral 100 denotes a recording medium such as a compact disk (CD); 110, a spindle motor for rotationally driving the disk 100; 120, a pickup having an optical system such as a semiconductor laser element or a lens; and 130, an actuator for shifting the pickup 120, such as a voice coil motor.

Reference numeral 210 denotes a motor driver for driving the spindle motor 110 and the voice coil motor 130, and consists of a spindle motor drive circuit and a voice coil motor drive circuit. In the motor driver 210 consisting of the spindle motor drive circuit and the voice coil motor drive circuit, the spindle motor drive circuit undergoes servo control so as to keep the relative speed of the head constant, and the voice coil motor drive circuit undergoes servo control so as to align the center of the head with that of the track.

Reference numeral 220 denotes a read amplifier for amplifying signals detected and photoelectrically converted by the pickup 120; 230, a signal processing circuit for regenerating data by subjecting read signals delivered from the read amplifier 220 to wave shaping, demodulating, error compensation and other modes of signal processing; 240, a decoder & interfacing circuit for decoding regenerated data and taking charge of delivery/reception between this apparatus and an external apparatus and controls; 250, a microcomputer with built-in flash memory for integrated control of the whole system embodying the invention as described above; and 260, a buffer cache memory for temporarily storing the data read out of the CD at high speed. The presence of this cache memory makes it possible, when a request for reading previously data or data belonging to the same sector as those data, to immediately send the data from the cache memory instead of reading the data out of the disk. If the speed of data reading by this medium reading apparatus is slower than the data transfer speed between the medium reading apparatus and another apparatus requesting the data, the use of the cache memory can serves to shorten the waiting time of that other apparatus.

A CD unit as a medium reading apparatus is composed of these motor driver 210, read amplifier 220, signal processing circuit 230, decoder & interfacing circuit 240, microcomputer with built-in flash memory 250 and cache memory 260, and this unit, combined with the spindle motor 110, pickup 120 and voice coil motor 130 constitute the CD-ROM drive unit 200 as an example of medium reading apparatus.

In the CD-ROM drive unit embodying the invention in this way, the microcomputer with built-in flash memory 250, on the basis of a signal supplied from the decoder & interfacing circuit 240, determines in what mode it is required to operate, and controls in the determined mode various sections of the system or figures out a sector position according to address information. The microcomputer with built-in flash memory 250, when it receives from a host computer 300 via the decoder & interfacing circuit 240 information including values of mechanism fluctuations of the drive unit to be stored in the built-in flash memory and characteristics of the CD-ROM to be played back, writes data into the user data area of the flash memory in accordance with the functions referred to above (see FIG. 7 through FIG. 9).

Figure 14A:
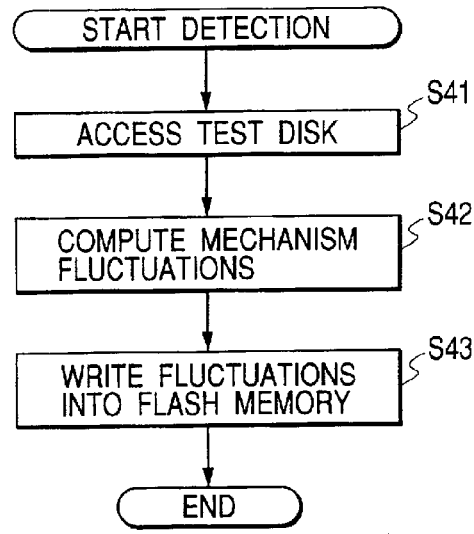
FIGS. 14(A) and 14(B) are flow charts showing an example each of specific procedure of detection of mechanism fluctuations and adjustment based on the values of fluctuations, respectively, in a CD-ROM drive unit in an embodiment of the invention.

More specifically, as shown in FIG. 14(A) for instance, a test disk is inserted into the drive unit and accessed (step S41). The information thereby obtained through a pickup is compared with optimal values prepared in advance to figure out any errors of the mechanism (step S42). The computed errors are written into the flash memory as fluctuation values of the drive unit (step S43). This processing is supposed to be performed, for instance, immediately before the manufacturer ships the drive unit.

Figure 14B:
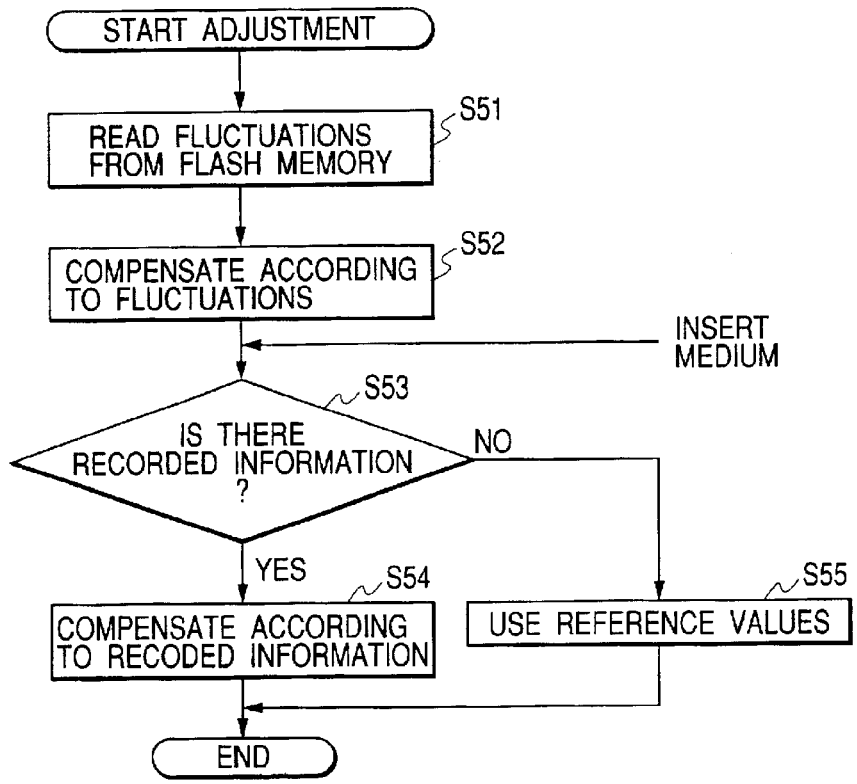
Figure 15:
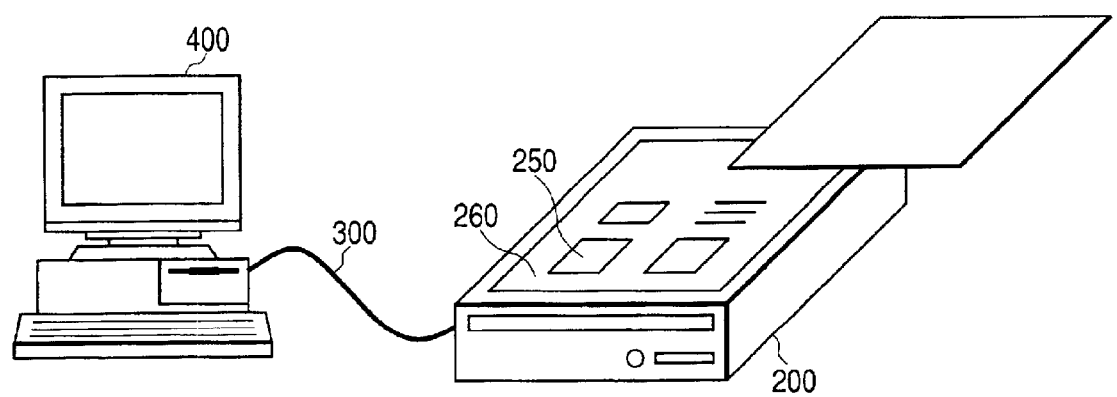
FIG. 15 is a schematic diagram of an example of configuration of an optical disk driver and a system using it as an example of medium reading apparatus.

On the other hand, after shipment, the microcomputer with built-in flash memory of the drive unit first reads the fluctuation values stored in the flash memory in a procedure shown in FIG. 14(B) at the time of turning on the power supply (step S51). On the basis of the fluctuation values, compensated values of the drive signals of the spindle motor 110 and the actuator 120, output level of the semiconductor laser and the like are computed, and compensation control is carried out on the basis of the compensation values thereby obtained (step S52). The microcomputer with built-in flash memory of the drive unit, at the time of accessing a disk, checks whether or not there is any information on the type and characteristics of medium recorded on the disk (step S53). If there is, the information is read out, and the output level of the semiconductor laser and the like are determined and, if necessary, compensated for on the basis of the data stored as initial values according to the type of the inserted medium (step S54). Alternatively, if there is no such information recorded, the medium is accessed using the initially set reference values (step S55).

In the case of a write once CD-R drive unit or a rewritable CD-RW drive unit, there are also available other controls than those shown in FIGS. 14(A) and 14(B). It can be so configured or provided with a user program that if, for instance, a medium of which no type information or characteristics information is recorded and therefore unknown is inserted, a prescribed test writing area, prepared in advance on the basis of initial values, be subjected to writing and verify-reading, and the intensity and irradiation time of the laser and the read signal level be written into the flash memory, thereby to make possible, the next time the same medium is inserted, control to achieve compensations by utilizing the information written in the flash memory. The cumulative duration of laser irradiation and the cumulative number of media may also be written into the flash memory.

The invention accomplished by the present inventor has been described so far with reference to a specific embodiment thereof, but the invention is not limited to this embodiment and obviously can be modified in many different ways without deviating from the true scope and spirit thereof. For instance, although in the foregoing embodiment one byte is allocated as the retrieval tag byte RTB to indicate whether or not one unit of user data in the user data area UDA of the flash memory, it is also possible to allocate one bit in the case of this embodiment. It is also possible to store in the retrieval tag byte RTB information indicating how many bytes from the top out of the 126 bytes are effective. Thus, such control is conceivable as setting a prescribed bit (e.g. the leading bit) of the eight bits of the retrieval tag byte RTB to "0" to indicate the significance of user data, and expressing the number of effective bytes by the remaining seven bits.

In the above-described embodiment, the size of each unit in the user data area UDA of the flash memory is 128 bytes, but the size can be altered as desired to 256 bytes or 64 bytes, for instance, by changing the number of memory cells connected to a word line. Furthermore, it is also possible to alter the unit size by processing with software to 256 bytes or 512 bytes. In that case, "+2" or "+3" can be added every time the unit pointer is updated at step S25 in FIG. 8, or two or three physical addresses may computed from the pointer count in write processing at step S26 to divide data writing into two or three rounds.

Although the above-described embodiment is supposed to be an external CD drive unit housed in a case separate from a personal computer, obviously the present invention is applicable to a CD drive unit built into a personal computer as well.

Although the foregoing description mainly referred to the application of the invention by the present inventor to a CD drive unit, which belongs to the background of the inventive attempt, the invention is not limited to that, but can as well be applied to recording medium reading apparatuses in general including a magneto-optic (MO) drive unit or a digital video disk (DVD) drive unit.

Benefits provided by typical aspects of the invention disclosed in this application are summarized below.

Thus, according to the invention, there can be provided a microcomputer with built-in flash memory capable of substantially increasing the rewrite frequency as viewed from outside even if the accommodable rewrite frequency of the memory element itself is relatively low, and thereby to make available an inexpensive medium reading apparatus requiring no EEPROM. It is further possible to realize a medium reading apparatus mounted with a microcomputer capable of writing data pertaining to the system into a built-in memory relatively many times even in the state of the final user's use, and moreover capable of restricting a cost increase.

What is claimed is:

1. A medium reading apparatus, comprising;
   a media drive for driving a medium on which first data are recorded;
   a drive circuit for electrically controlling and driving the media drive;

a read device for reading the first data recorded on said medium as electric signals;

a signal processing circuit for processing output signals of the read device and reproducing data;

and a control device for controlling said drive circuit and the signal processing circuit, wherein the control device includes a semicondutor integrated circurt in which a central processing unit, a random access memo and a nonvolatile memory are formed on a single semiconductor chip, wherein the central processing unit controls the control device, wherein the random access memory temporarily stores data and provides a work area to the central processing unit, wherein the nonvolatile memory includes a first area in which user data are stored, a second area in which an application program is stored, and a third area in which a vector table, accessed when a predetermined interrupt occurs to the central processing unit, is stored, wherein the nonvolatile memory is operable to electrically write data unit by unit and electrically erase data block by block, wherein the first area includes a plurality of blocks, each of the blocks having a plurality of units, wherein each of the units includes a fourth area in which bits to manage user data are stored and a fifth area in which user data are stored, wherein if user data are not written in the fifth area, first bits are written in the fourth area, and if use, data are written in the fifth area, second bits are written in the fourth area, and wherein the first bits of the fourth area are rewritten to the second bits when user data are written in the fifth area.

2. The medium reading apparatus according to claim 1, wherein said nonvolatile memory includes a region formed by a process for forming the central processing unit.

3. The medium reading apparatus according to claim 1, wherein when a value of a unit pointer increments a first time, the bits of the fourth are of the unit indicated by the value of the unit pointer are read and if the bits of the fourth area of the unit indicate by the value of the unit pointer are matched to the second bits, then the value of the unit pointer increments a second time.

4. The medium apparatus according to claim 3, wherein when a number of the units corresponding to a size of a block is counted by an increment operation of the unit pointer, data stored in the counted units are erased.

5. The medium reading apparatus according to claim 1, wherein the user data written into said nonvolatile memory includes data regarding a type of said medium.

6. The medium reading apparatus according to claim 1, wherein each fourth area includes a sixth area in which second data for use in checking the user data stored in a corresponding fifth area is stored, and wherein each fourth area includes a seventh area in which arbitrary one of the first bits and the second bits can be stored.

7. The medium reading apparatus according to claim 6, wherein the second data are used as a check data SUM, wherein before user data are written in a predetermined area of the units, the second data are generated by he control device, and then user data and the second data are written in the predetermined area, and wherein after user data are written in the predetermined area, user data are read from the predetermined area, processed and compared with the second data in the predetermined area to determine whether there is an error in connection with the user data written in the predetermined area.

8. The medium reading apparatus according to claim 7, wherein if the error is detected, the user data written in the unit preceding the redetermined area are read.

9. The medium reading apparatus according to claim 1, wherein the user data includes third data concerning manufacturing fluctuations in said media drive and said read device.

10. The medium reading apparatus according to claim 1, wherein the user data includes fourth data concerning characteristics of the medium obtained by accessing said medium.

11. The medium reading apparatus according to claim 1, wherein data a erasure of the nonvolatile memory includes writing of prescribed data.

12. The medium reading apparatus according to claim 1, wherein when a value of a unit pointer decrements, the bits of the fourth area of the unit indicated by the value of the unit pointer are read, then if the bits of the fourth area of the unit indicated by the value of the unit pointer are matched to the first bits, the user data are stored in the unit indicated by the value of the unit pointer, then if the bits of the fourth area of the unit indicated by the value of the unit pointer are matched to the second bits, the value of the unit pointer decrements again.

13. The medium reading apparatus according to claim 12, wherein when a number of the units corresponding to a size of a block is counted by a decrement operation of the unit pointer, data stored in the first area are erased.

14. The medium reading apparatus according to claim 1, wherein the control device manages a unit pointer to determine which unit user data is written to and which unit user data is read from.

15. A semiconductor integrated circuit, comprising:

a nonvolatile memory for electrically writing data unit by unit and electrically erasing data block by block a central processing unit;

and a random access memory for temporarily storing data and providing a work area to the central processing unit, wherein the nonvolatile memory, the central processing unit and the random access memory are formed on a single semiconductor chip, wherein the nonvolatile memory includes a first area in which first data are stored, a second area in which a predetermined program is stored, and a third area in which a vector table, accessed when a predetermined interrupt occurs to the central processing unit, is stored, wherein the first area of the nonvolatile memory includes a plurality of the blocks and each of the blocks includes a plurality of units, wherein each of the units includes a fourth are in which bits to manage first data are stored and a fifth are in which first data are stored, wherein if first data are not written into the fifth area, first bits are written into the fourth area, and if first data are written into the fifth area, second bits are written into the fourth area, and wherein the first bits of the fourth area are rewritten to the second bits when first data are written in the fifth area.

16. The semiconductor integrated circuit according to claim 15, wherein said nonvolatile memory includes a region formed by a process for forming the central processing unit.

17. The semiconductor integrated circuit according to claim 15, wherein when a value of a unit pointer increments a first time, the bits of the fourth are of the unit indicated by the value of the unit pointer are read, then if the bits of the fourth area in the unit indicate by the value of the unit pointer are matched to the first bits, the first data are stored in the unit indicated by the value of the unit pointer, and if the bits of the fourth area of the unit indicated by the value of the unit pointer are matched to the second bits, the value of the unit pointer increments a second time.

18. The semiconductor integrated circuit according to claim 15, wherein when a number of the units corresponding to a size of a block are counted by an increment operation of the unit pointer, data stored in the counted units are erased.

19. The semiconductor integrated circuit according to claim 15,
wherein each fourth area includes a sixth area in which second data for checking the first data stored in a corresponding fifth area are stored, and
wherein each fourth area includes a seventh area in which arbitrary one of the first bits and the second bits can be stored.

20. The semiconductor integrated circuit according to claim 19,
wherein the second data are used as a check data SUM,
wherein before first data are written in a predetermined area of the units, the second data are generated and then user data and the second data are written in the predetermined area, and
wherein after first data are written in the predetermined area, first data are read from the predetermined are processed and compared with the second data in the predetermined area to determine whether there is an error in connection with the first data written in the predetermined area.

21. The semiconductor integrated circuit according to claim 15, wherein a data erasure of the nonvolatile memory includes writing of prescribed data.

22. The semiconductor integrated circuit according to claim 15, wherein when a value of a unit pointer decrements, the bits of the fourth area of the unit indicated by the value of the unit pointer are read, then if the bits of the fourth area of the unit indicated by the value of the unit pointer are matched to the first bits, the first data are stored in the unit indicated by the value of the unit pointer, then if the bits of the fourth area of the unit indicated by the value of the unit pointer are matched to the second bits, the value of the unit pointer decrements again.

23. The semiconductor integrated circuit according to claim 22, wherein when a number of units corresponding to a size of a block is counted by a decrement operation of the unit pointer, data stored in the counted units are erased.

24. The semiconductor integrated circuit according to claim 15, wherein the semiconductor integrated circuit manages a unit pointer to determined which unit first data is written to and which unit first data is read from.

25. A semiconductor integrated circuit formed on a single semiconductor chip, comprising:
a central processing unit;
a random access memory, coupled to the central processing unit, to temporarily store data and provide a work area to the central processing unit; and
a nonvolatile memory, coupled to the central processing unit, including a first area in which data are store, a second area in which a predetermined program is stored, and a third area in which a vector table is stored, the first area including a plurality of blocks each having a plurality of units, each of the units including a fourth area in which bits to manage user data are stored and a fifth area in which the user data are stored, the nonvolatile memory being operable to write data unit by unit and read data block by block;
wherein first bits are written into the fourth area of a unit when the unit is erased, and second bits are written into the fourth area of the unit when the user data are written into the fifth area of the unit.

* * * * *